United States Patent
Takizawa

(10) Patent No.: US 7,802,160 B2
(45) Date of Patent: Sep. 21, 2010

(54) TEST APPARATUS AND CALIBRATION METHOD

(75) Inventor: Shigeki Takizawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 389 days.

(21) Appl. No.: 11/951,335

(22) Filed: Dec. 6, 2007

(65) Prior Publication Data

US 2009/0150733 A1 Jun. 11, 2009

(51) Int. Cl.
*G01R 31/28* (2006.01)

(52) U.S. Cl. .................... 714/734; 714/25; 714/12; 714/724; 714/733; 714/744; 714/709; 702/108; 702/124; 324/765; 327/172; 327/175

(58) Field of Classification Search ............. None
See application file for complete search history.

(56) References Cited

U.S. PATENT DOCUMENTS

| | | | | |
|---|---|---|---|---|
| 4,646,299 A | * | 2/1987 | Schinabeck et al. | 714/736 |
| 5,315,164 A | * | 5/1994 | Broughton | 327/175 |
| 6,025,708 A | * | 2/2000 | Stickler | 324/158.1 |
| 6,202,186 B1 | * | 3/2001 | Oonk | 714/738 |
| 6,505,315 B1 | * | 1/2003 | Kojima | 714/724 |
| 2003/0110427 A1 | * | 6/2003 | Rajsuman et al. | 714/724 |
| 2003/0140286 A1 | * | 7/2003 | Shinbo et al. | 714/699 |
| 2006/0273811 A1 | * | 12/2006 | Haigh et al. | 324/761 |
| 2006/0279310 A1 | * | 12/2006 | Walker et al. | 324/765 |
| 2007/0159224 A1 | * | 7/2007 | Dwarka et al. | 327/175 |

FOREIGN PATENT DOCUMENTS

| | | |
|---|---|---|
| JP | H05-78037 | 10/1993 |
| JP | 11-306688 | * 11/1999 |
| JP | 2002-156422 | 5/2002 |

* cited by examiner

*Primary Examiner*—John P Trimmings
(74) *Attorney, Agent, or Firm*—Jianq Chyun IP Office

(57) ABSTRACT

A test apparatus that tests a device under test is provided, including a driver section that supplies a test signal to a corresponding pin of the device under test, a judgment section that makes a judgment concerning pass/fail of the device under test based on the response signal output by the device under test in response to the test signal, a voltage measuring section that detects a DC voltage of the signal output by the driver section, and an output side adjusting section that adjusts a duty ratio of the signal output by the driver section according to the DC voltage detected by the voltage measuring section.

20 Claims, 9 Drawing Sheets

TEST APPARATUS AND CALIBRATION METHOD

BACKGROUND

1. Technical Field

The present invention relates to a test apparatus and a calibration method of a test apparatus. More particularly, the present invention relates to a test apparatus that tests a device under test and a calibration method for adjusting a duty ratio of a test signal.

2. Related Art

In recent years, the speed of semiconductor circuits and the like has been greatly increased. Along with this, an increase in the speed of test apparatuses testing the semiconductor circuits and the like is also desired, leading to manufacturing of test apparatuses that generate test signals of multiple GHz. Because the test signals of such test apparatuses are high frequency, it is necessary to adjust the duty ratio of the test signals with high precision. To adjust the duty ratio of the test signals, beginning by measuring the duty ratio of the test signal is considered.

For example, the duty ratio of the test signal can be measured by bringing a probe into contact with an output pin of the test apparatus to measure each edge timing of the test signal. In a case where a plurality of output pins are disposed on the test apparatus, the duty ratio of the test signal from each output pin can be measured by sequentially bringing the probe into contact with each output pin.

However, in a case where the duty ratio of a test signal of multiple GHz is measured, the edge timing must be measured with an error range of multiple ps, which requires use of a timing measurer having extremely high precision or the use of a probe with little signal degradation. Because of this, the cost of testing undesirably rises.

Furthermore, a multitude of output pins are disposed on the test apparatus according to the number of pins of the semiconductor circuit or the like. Because of this, the testing time is undesirably increased when the probe is sequentially brought into contact with each pin to measure the duty ratio of the test signal. It should be noted that Japanese Patent Application Publication No. hei11-306688 is listed herein as a prior art document.

SUMMARY

Therefore, it is an object of an aspect of the innovations herein to provide a test apparatus and a calibration method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a test apparatus that tests a device under test. The test apparatus includes a driver section that supplies a test signal to a corresponding pin of the device under test, a judgment section that makes a judgment concerning pass/fail of the device under test based on a response signal output by the device under test in response to the test signal, a level measuring section that detects a DC level of the signal output by the driver section, and an output side adjusting section that adjusts a duty ratio of the signal output by the driver section according to the DC level detected by the level measuring section.

According to a second aspect related to the innovations herein, one exemplary method may include a calibration method for adjusting a duty ratio of a test signal in a test apparatus that includes a plurality of driver sections that each supply a test signal to a corresponding pin of a device under test and a judgment section that makes a judgment concerning pass/fail of the device under test based on the signal output by the device under test in response to the test signal. The calibration method includes detecting a DC level of the signal output by the driver section and adjusting the duty ratio of the signal output by the driver section according to the detected DC level.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
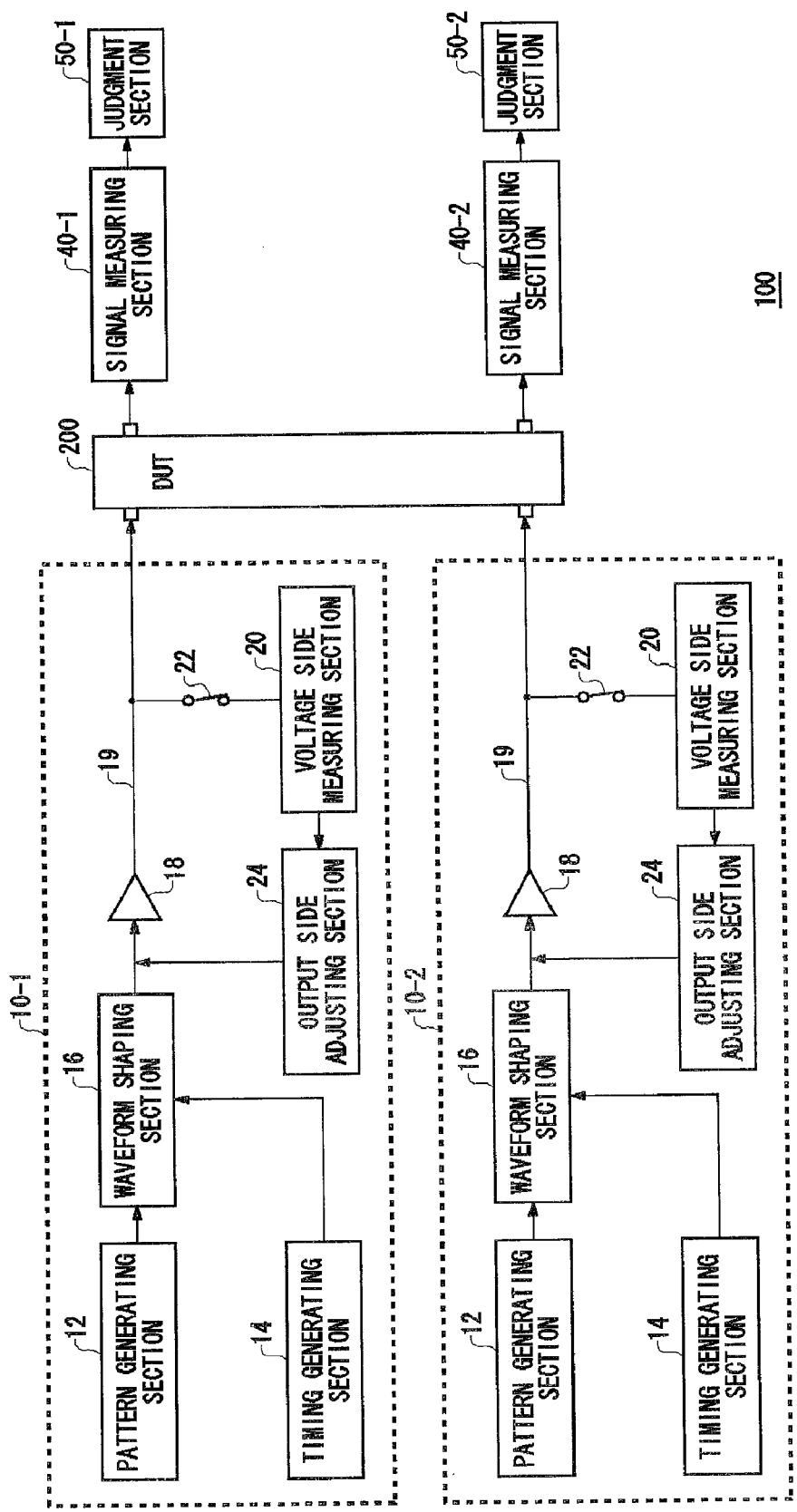
FIG. 1 shows a configuration of a test apparatus 100 according to the present embodiment along with a device under test 200.

FIG. 1 shows a configuration of a test apparatus 100 according to the present embodiment along with a device under test 200. The test apparatus 100 is an apparatus that tests the device under test 200 such as a semiconductor circuit and is provided with a plurality of signal generating sections 10, a plurality of signal measuring sections 40, and a plurality of judgment sections 50.

The test apparatus 100 accurately detects a duty ratio of a signal by measuring a DC voltage of the signal output by each signal generating section 10. Here, the DC voltage is one example of a DC level. The signal generating section 10 is then adjusted such that the duty ratio becomes a prescribed value. Through such a configuration, the duty ratio of the signal output by each signal generating section 10 can be accurately adjusted.

First, the basics of the test apparatus 100 will be described. Each signal generating section 10 is connected to one of the input pins of the device under test. Each signal generating section 10 generates a test signal and supplies the test signal to the device under test 200 via the corresponding input pin. The test signal may be, for example, a digital signal to be input into a digital circuit of the device under test 200, an analog signal to be input into an analog circuit of the device under test 200, a control signal to be input into a control circuit of the device under test 200, a clock signal to be input into a clock terminal of the device under test 200, a signal supplied as a source power to drive the device under test 200, or the like. The configuration and operation of each signal generating section 10 is described hereinafter.

The device under test 200 operates according to a supplied test signal to output a response signal. The response signal may be a digital signal or an analog signal.

Each signal measuring section 40 is connected to one of the output pins of the device under test 200. Each signal measuring section 40 measures the response signal output from the corresponding output pin. For example, each signal measuring section 40 may measure a logic pattern of the response signal or may measure an analog waveform of the response signal. Furthermore, each signal measuring section 40 may measure timing information such as an edge timing or the like of the response signal.

The plurality of judgment sections 50 are disposed to correspond one-to-one with the plurality of signal measuring sections 40. Each judgment section 50 makes a judgment concerning pass/fail of the device under test 200 based on a measurement result from the corresponding signal measuring section 40. For example, each judgment section 50 may make the judgment concerning pass/fail of the device under test 200 based on whether the logic pattern of the response signal measured by the corresponding signal measuring section 40 matches a prescribed expected value pattern. Here, an example is described above in which one device under test 200 is tested, but the test apparatus 100 may simultaneously test a plurality of devices under test 200.

Next, a method for adjusting the duty ratio of the signal output by each signal generating section 10 will be described. Each signal generating section 10 includes a pattern generating section 12, a timing generating section 14, a waveform shaping section 16, a driver section 18, a transmission path 19, a voltage measuring section 20, a switching section 22, and an output side adjusting section 24. Here, the voltage measuring section 20 is one example of a level measuring section.

The pattern generating section 12 generates a logic pattern to be included in the signal output by the signal generating section 10. For example, the pattern generating section 12 may generate a prescribed logic pattern by operating according to a test program supplied by a user or the like.

The timing generating section 14 generates timing information of the signal output by the signal generating section 10. For example, the timing generating section 14 may generate a clock that designates a bit rate or a period of the signal output by the signal generating section 10.

The waveform shaping section 16 shapes a waveform of the test signal based on the logic pattern generated by the pattern generating section 12 and the timing information generated by the timing generating section 14. For example, the waveform shaping section 16 may generate a test signal that has substantially the same bit rate as the clock generated by the timing generating section 14 and that has the logic pattern generated by the pattern generating section 12.

The driver section 18 supplies the test signal generated by the waveform shaping section 16 to the corresponding input pin of the device under test 200. Furthermore, the driver section 18 may supply a current consumed by the device under test 200. Yet further, the driver section 18 may receive a differential test signal from the waveform shaping section 16, convert the received signal to a single-end signal, and supply the thus converted signal to the device under test 200.

The transmission path 19 is disposed between an output terminal of the driver section 18 and an input terminal of the device under test 200 and transmits the test signal output by the driver section 18 to the device under test 200. The switching section 22 is disposed between the transmission path 19 and the voltage measuring section 20 and switches whether the voltage measuring section 20 is connected to the transmission path 19.

The voltage measuring section 20 detects the DC voltage of the signal output by the driver section 18. The DC voltage of the signal is designated according to the duty ratio of the signal. For example, the DC voltage of a clock signal with a duty ratio of 50% is an intermediate voltage between a logic H signal voltage and a logic L signal voltage. Because of this, the duty ratio of the signal can be detected by detecting with the voltage measuring section 20 the DC voltage of the signal output by the driver section 18.

The output side adjusting section 24 adjusts the duty ratio of the signal output by the driver section 18 according to the DC voltage detected by the voltage measuring section 20. For example, the output side adjusting section 24 may adjust the duty ratio of the signal output by the driver section 18 in a manner to decrease a difference between the DC voltage detected by the voltage measuring section 20 and a predetermined target value.

The output side adjusting section 24 may adjust the duty ratio by adjusting the driver section 18 or may adjust the duty ratio by adjusting the signal input into the driver section 18. Generally, even where the pattern generating section 12 and the timing generating section 14 generate a test signal in which the duty ratio is set to be 50%, there are cases where the duty ratio of the generated test signal is not 50% because of the affect of error, noise, and the like in the circuit. The output side adjusting section 24 may adjust the error of such a duty ratio.

Each voltage measuring section 20 may be a circuit in common with the circuit used at a time when performing voltage measurement while applying a current. In other words, the voltage measuring section 20 may be disposed in a manner to be capable of measuring the voltage level applied to the device under test 200 while supplying the prescribed current to the device under test 200. In a case where voltage measuring section 20 performs voltage measurement while applying the current, the judgment section 50 may make the judgment concerning pass/fail of the device under test 200 based on the voltage level measured by the voltage measuring section 20.

In the manner described above, the duty ratios of the signals output by each signal generating section 10 can be simultaneously measured and adjusted by disposing the voltage measuring section 20 and the output side adjusting section 24 in each signal generating section 10. In other words, the duty ratios of the signals generated by each signal generating section 10 can be measured without sequentially bringing a measuring probe or the like into contact with each signal generating section 10.

In such a case, each pattern generating section 12 and timing generating section 14 can output adjustment signals to the corresponding driver section 18 at substantially the same time. Furthermore, each voltage measuring section 20 can detect the DC voltage of the adjustment signals output by the corresponding driver section 18 at substantially the same time.

Furthermore, the duty ratio can be accurately measured with a simple configuration because the duty ratio of the signal is measured by detecting the DC voltage of the signal in the voltage measuring section 20. For example, in a case where a signal is measured in which the logic H voltage level Vh is 1 V, the logic L voltage level V1 is 0 V, and the period T is 308 ps (3.25 GHz), the voltage measurement resolution of the voltage measuring section 20 becomes 1 mV. The time resolution of the duty measurement at this time becomes $$T/(Vh-V1)=308/(1000-0)=0.308 \text{ ps}$$

and the duty of the signal can be accurately measured.

Furthermore, as made clear from the above formula, in a case where the duty is measured by detecting the DC voltage of the signal, the time resolution becomes more precise and the duty can be more accurately measured as the period T of the signal becomes smaller. In other words, the test apparatus 100 of the present embodiment can more accurately measure the duty of higher frequency signals.

As described above, the voltage measuring section 20 can be provided in common with the circuit that performs the voltage measurement while applying the current. Because of this, adjustment of the duty ratio can be performed easily without enlarging the circuit configuration of the test apparatus 100.

Furthermore, the output side adjusting section 24 adjusts the duty ratio in advance before testing of the device under test 200 is performed. In a case where the test signal supplied to the device under test 200 includes a repeating pattern, such as a clock signal, for example, the output side adjusting section 24 may adjust the duty ratio during testing of the device under test 200. In addition, the switching section 22 need not pass a signal with a large bandwidth because having the voltage measuring section 20 be able to detect the DC voltage of the signal is sufficient.

Here, in FIG. 1, a configuration is shown in which the voltage measuring section 20 directly controls the output side adjusting section 24, but the voltage measuring section 20 may control the output side adjusting section 24 via a control system and a computer or the like. In such a case, the computer receives a value of the DC voltage of the adjustment signals measured by the voltage measuring section 20 from the control system before testing the device under test 200.

The computer then generates correction data to be supplied to the output side adjusting section 24 from the value of the received DC voltage and sets the correction data in the output side adjusting section 24 via the control system. The output side adjusting section 24 adjusts the duty ratio of the signal output by the driver section 18 based on the received correction data.

Furthermore, the control system and the computer or the like may adjust in advance the duty ratio of the signal output by the driver section 18 before testing the device under test 200. The following is a description of a function of the test apparatus 100 using a configuration in which the aforementioned control system and computer or the like are omitted. Furthermore, a case is described in which the duty ratio is calibrated in advance by the driver section 18 before testing of the device under test 200.

Figure 2:
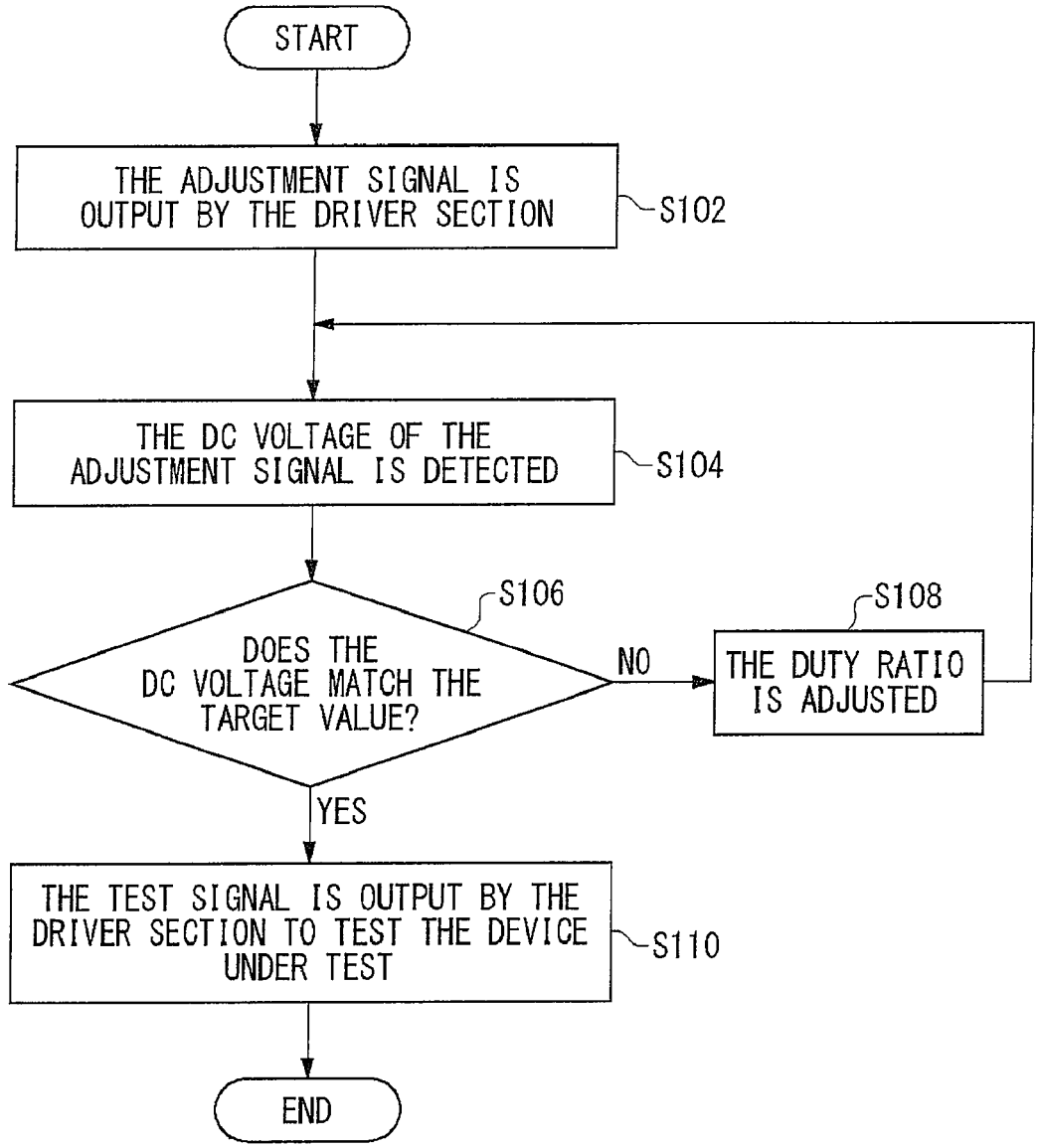
FIG. 2 is a flow chart describing an exemplary operation of the test apparatus 100.

FIG. 2 is a flow chart describing an exemplary operation of the test apparatus 100. The test apparatus 100 of the present embodiment adjusts in advance the duty ratio of the signal output by the driver section 18 before testing the device under test 200.

First, in each signal generating section 10, before the driver section 18 supplies the test signal to the device under test 200, the pattern generating section 12, the timing generating section 14, and the waveform shaping section 16 output to the driver section 18 the adjustment signal having a predetermined pattern (S102). The adjustment signal may be a clock signal that has a period substantially the same as the test signal to be generated during testing of the device under test 200, for example.

Next, the voltage measuring section 20 detects the DC voltage of the adjustment signal output by the driver section 18 (S104). The output side adjusting section 24 then makes a judgment as to whether the DC voltage detected by the voltage measuring section 20 when the driver section 18 output the adjustment signal matches the target value (S106). Here, the target value may be a value set in advance by the user or the like according to the duty ratio to be set or a value measured in advance by the test apparatus 100.

In a case where the DC voltage does not match the target value at S106, the output side adjusting section 24 adjusts the duty ratio of the adjustment signal output by the driver section 18 (S108) and repeats the processes from step S104. In a case where the DC voltage matches the target value at S106, the test apparatus 100 ends adjustment of the duty ratio and begins testing of the device under test 200 (S110). Through such an operation, the duty ratio of the signal output by the driver section 18 can be adjusted in advance.

Figure 3:
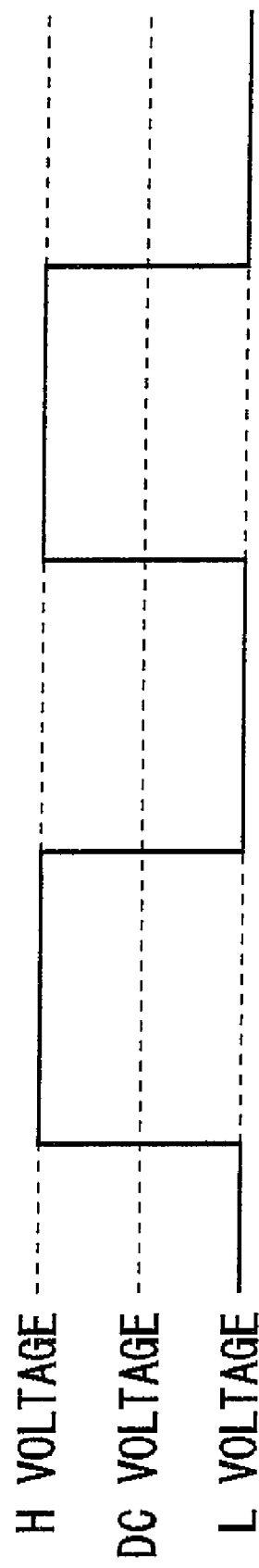
FIG. 3 describes an exemplary method for acquiring in advance a target value described in relation to S106 in FIG. 2.

FIG. 3 describes an exemplary method for acquiring in advance the target value described in relation to S106 in FIG. 2. In the present embodiment, the pattern generating section 12 and the timing generating section 14 sequentially output to the driver section 18 a fixed H adjustment signal that is fixed at logic H, a fixed L adjustment signal that is fixed at logic L, and a reference adjustment signal in which logic H and logic L are alternately repeated. In FIG. 3, the reference adjustment signal is represented by a solid line.

The voltage measuring section 20 measures in advance the signal voltage of the fixed H adjustment signal and the fixed L adjustment signal (voltage H and voltage L). The output side adjusting section 24 then adjusts the duty ratio in the driver section 18 such that the DC voltage of the reference adjustment signal detected by the voltage measuring section 20 becomes a prescribed relative level in relation to the voltage H and the voltage L. For example, in a case where the duty ratio is set to 50%, the output side adjusting section 24 adjusts the duty ratio in the driver section 18 such that the DC voltage of the reference adjustment signal becomes a substantially intermediate level between the voltage H and the voltage L.

Figure 4:
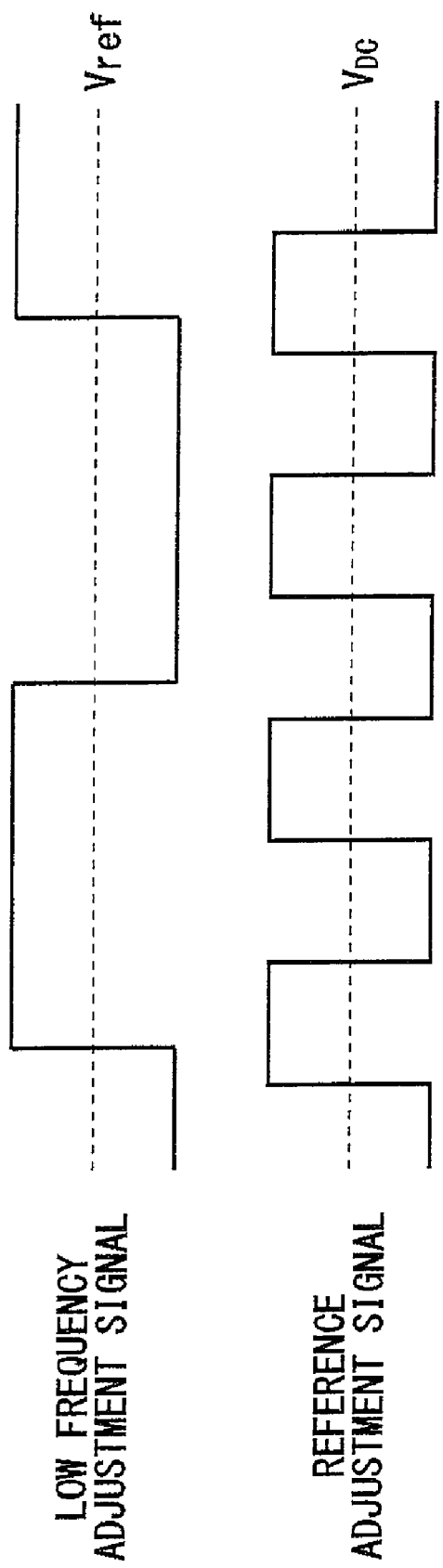
FIG. 4 describes another exemplary method for acquiring in advance the target value.

FIG. 4 describes another exemplary method for acquiring the target value in advance. In the present embodiment, the pattern generating section 12 and the timing generating section 14 sequentially output to the driver section 18 a low frequency adjustment signal that has a duty ratio substantially equal to the test signal and a frequency lower than the frequency of the test signal to be supplied to the device under test 200 and a reference adjustment signal that has a frequency substantially equal to the frequency of the test signal to be supplied to the device under test 200.

The voltage measuring section 20 measures in advance the DC voltage Vref of the low frequency adjustment signal. The output side adjusting section 24 then adjusts the duty ratio in the driver section 18 such that the DC voltage $V_{DC}$ of the reference adjustment signal detected by the voltage measuring section 20 becomes a level that is substantially the same as the DC voltage Vref of the low frequency adjustment signal.

In the low frequency signal, because the error of the edge timing becomes relatively small in relation to the signal period, the error arising in the duty ratio caused by the edge timing error also becomes small. Because of this, the duty ratio of the reference adjustment signal can be accurately adjusted by adjusting the DC voltage of the reference adjustment signal such that the DC voltage of the relatively low frequency signal is set to the target value.

Figure 5:
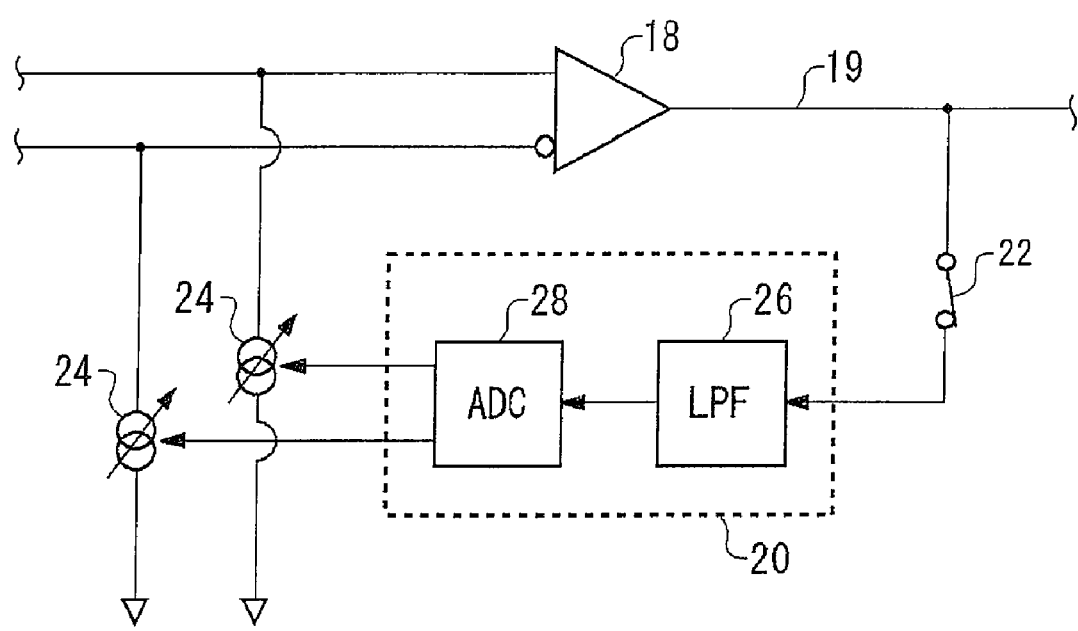
FIG. 5 shows an exemplary configuration of a voltage measuring section 20.

FIG. 5 shows an exemplary configuration of a voltage measuring section 20. The voltage measuring section 20 of the present embodiment includes a low-pass filter 26 and an A-D converter 28. The low-pass filter 26 receives the adjustment signal transmitted on the transmission path 19 by branching and causes a low frequency component included in the current component to be passed therethrough. The low-pass filter 26 may cause the frequency component in a vicinity of the current component to be passed therethrough with a predetermined frequency range.

The A-D converter 28 converts the signal voltage of the analog signal passed by the low-pass filter 26 into a digital value. Furthermore, the A-D converter 28 supplies the converted digital value 28 to the output side adjusting section 24.

The output side adjusting section 24 adjusts the duty ratio of the signal output by the driver section 18 according to the digital value acquired from the A-D converter 28. The output side adjusting section 24 of the present embodiment adjusts a bias voltage of the test signal supplied from the waveform shaping section 16 to the driver section 18 according to the digital value received from the A-D converter 28. More specifically, the output side adjusting section 24 adjusts the bias voltage of the test signal by adjusting a bias current supplied to the transmission path that transmits the test signal from the waveform shaping section 16 to the driver section 18. Here, the bias voltage is one example of a bias level.

Furthermore, the driver section 18 of the present invention receives the differential test signal, converts the received signal into a single-end test signal, and outputs the converted signal. In such a case, the output side adjusting section 24 may be disposed on both a transmission path on a non-inverted side and a transmission path on an inverted side and may adjust the bias current supplied to each transmission path.

Figure 6:
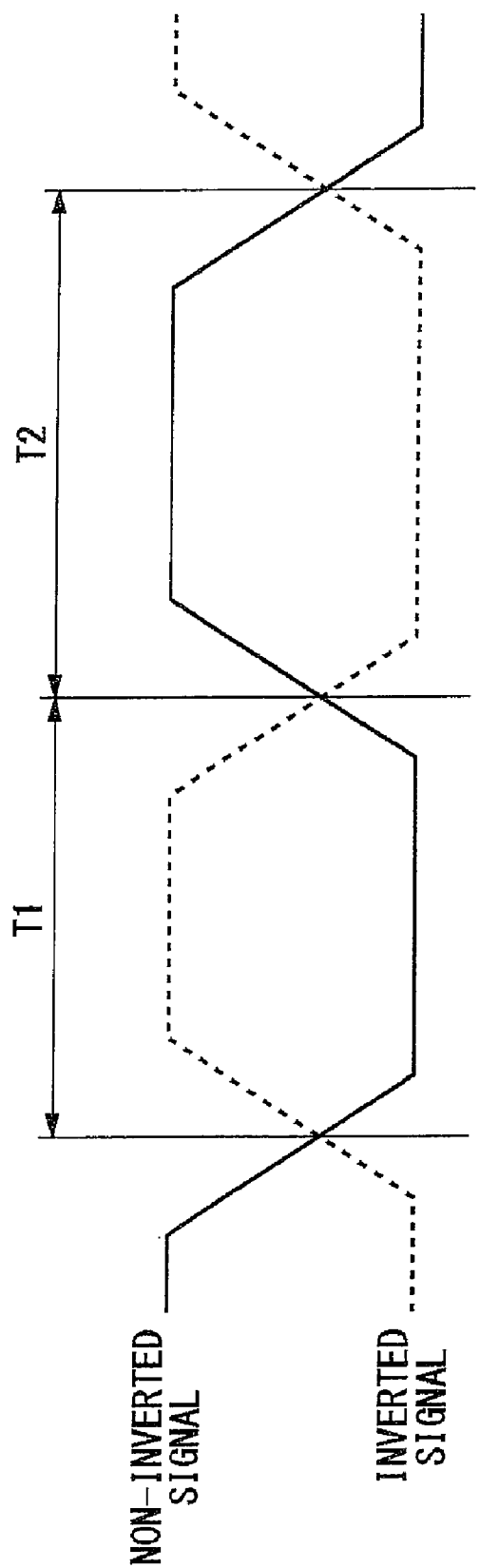
FIG. 6 shows an example of a differential test signal input to a driver section 18.

FIG. 6 shows an example of a differential test signal input to the driver section 18. In FIG. 6, the non-inverted signal of the test signal is represented by a solid line and the inverted signal of the test signal is represented by a dotted line. The duty ratio of the differential test signal is determined by an interval ratio T1:T2 between the cross points of the non-inverted signal and the inverted signal.

Even where the pattern generating section 12 and the timing generating section 14 generate a test signal in which the duty ratio is set to 50% (T1:T2=1:1), there are cases where the duty ratio does not become 50% because of the effect of error in the circuit, as shown in FIG. 6. The output side adjusting section 24 of the present embodiment adjusts the duty ratio of the signal output by the driver section 18 by adjusting at least one of the bias voltages to be supplied to the inverted signal or the non-inverted signal according to the DC voltage detected by the voltage measuring section 20.

Figure 7:
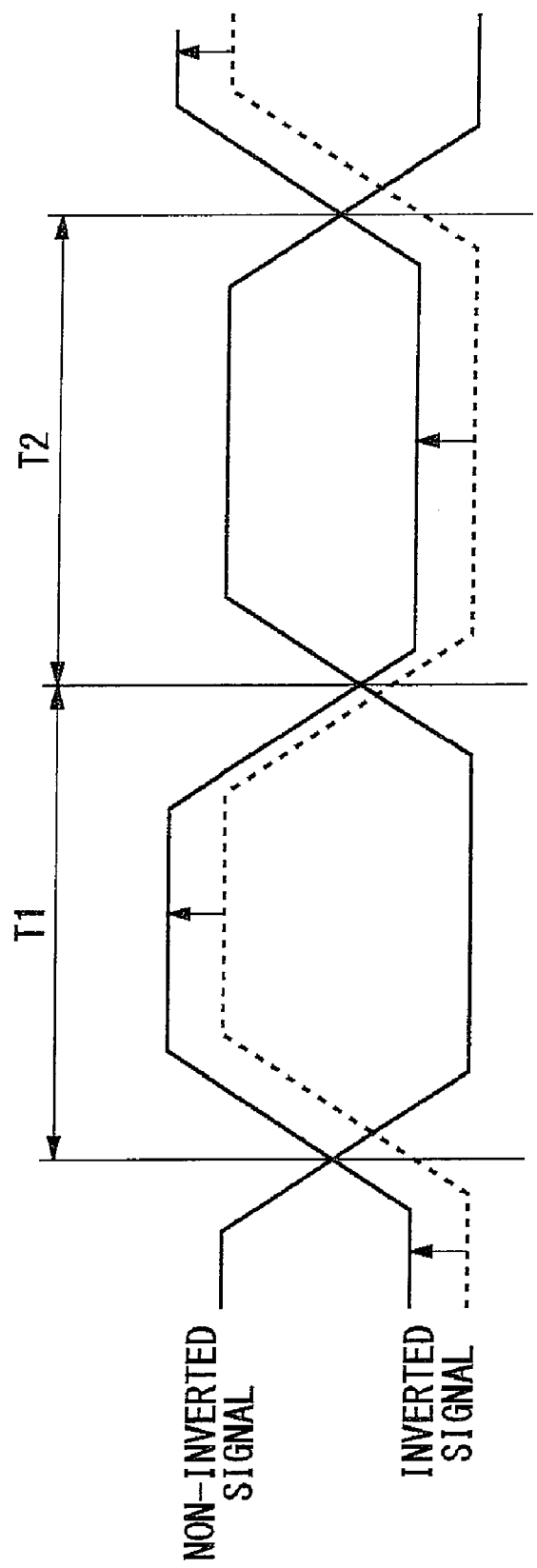
FIG. 7 shows an example of a test signal in which the bias voltage is adjusted by an output side adjusting section 24.

FIG. 7 shows an example of a test signal in which the bias voltage is adjusted by the output side adjusting section 24. The output side adjusting section 24 of the present embodiment adjusts the bias voltage of the inverted signal. As shown in FIG. 7, the duty ratio of the differential signal is adjusted to be a prescribed value by adjusting the bias voltage of the differential signal.

Furthermore, in a case where the frequency of the test signal to be supplied to the device under test 200 is changed, the output side adjusting section 24 may adjust in advance the duty ratio of the signal output by the driver section 18 according to the frequency before the test signal is supplied to the device under test 200. For example, every time the frequency of the test signal to be supplied to the device under test 200 is changed, the signal generating section 10 may adjust the duty ratio in the driver section 18 using an adjustment signal that has a frequency according to the frequency of the test signal.

Furthermore, the signal generating section 10 may generate in advance a table that shows the bias voltage to be generated by the output side adjusting section 24 for every frequency. The voltage measuring section 20 may, for example, sequentially output from the driver section 18 a plurality of adjustment signals having different frequencies and generate the table by detecting each DC voltage.

Furthermore, the output side adjusting section 24 may adjust the duty ratio of the signal output by the driver section 18 further according to the temperature of the driver section 18. For example, the output side adjusting section 24 may adjust the bias voltage of the differential signal according to a value obtained by multiplying a coefficient according to the temperature of the driver section 18 by a digital value supplied from the A-D converter 28 of the voltage measuring section 20.

Figure 8:
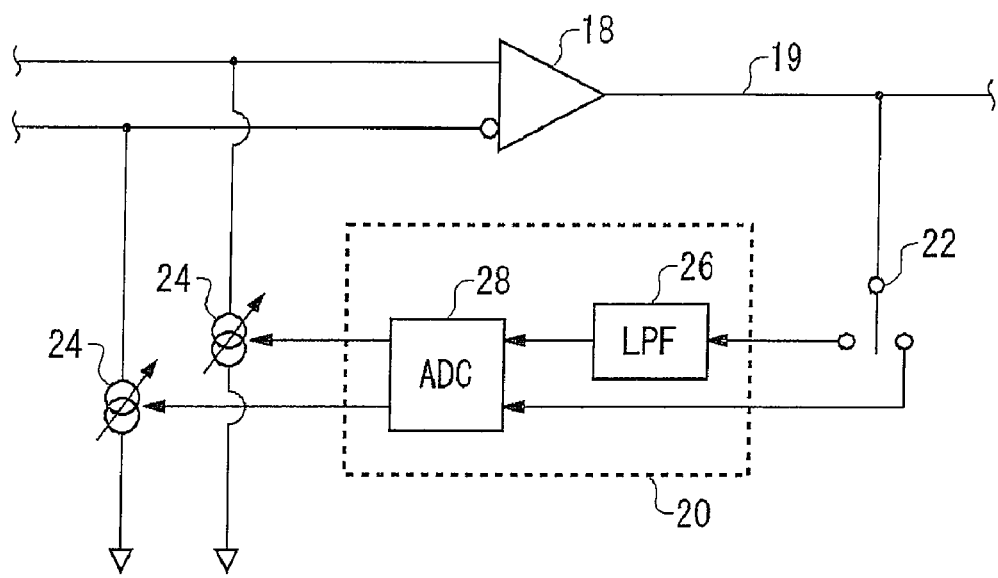
FIG. 8 shows another exemplary configuration of a switching section 22.

FIG. 8 shows another exemplary configuration of the switching section 22. In a case where the duty ratio is measured in the driver section 18, the switching section 22 of the present embodiment causes the signal transmitted on the transmission path 19 to be measured by the voltage measuring section 20 using the low-pass filter 26. Furthermore, in a case where the level of the DC voltage applied to the device under test 200 is measured during the voltage measurement performed while current is being applied, the switching section 22 causes the signal transmitted on the transmission path 19 to be measured by the voltage measuring section 20 without using the low-pass filter 26. Therefore, frequency characteristics of the voltage measuring section 20 can be adjusted according to the measurement target. Here, when the voltage measurement is performed while the current is being applied, the A-D converter 28 may supply to the judgment section 50 a digital value obtained by converting the input voltage level. The judgment section 50 may make a judgment concerning pass/fail of the device under test 200 according to the digital value.

Figure 9:
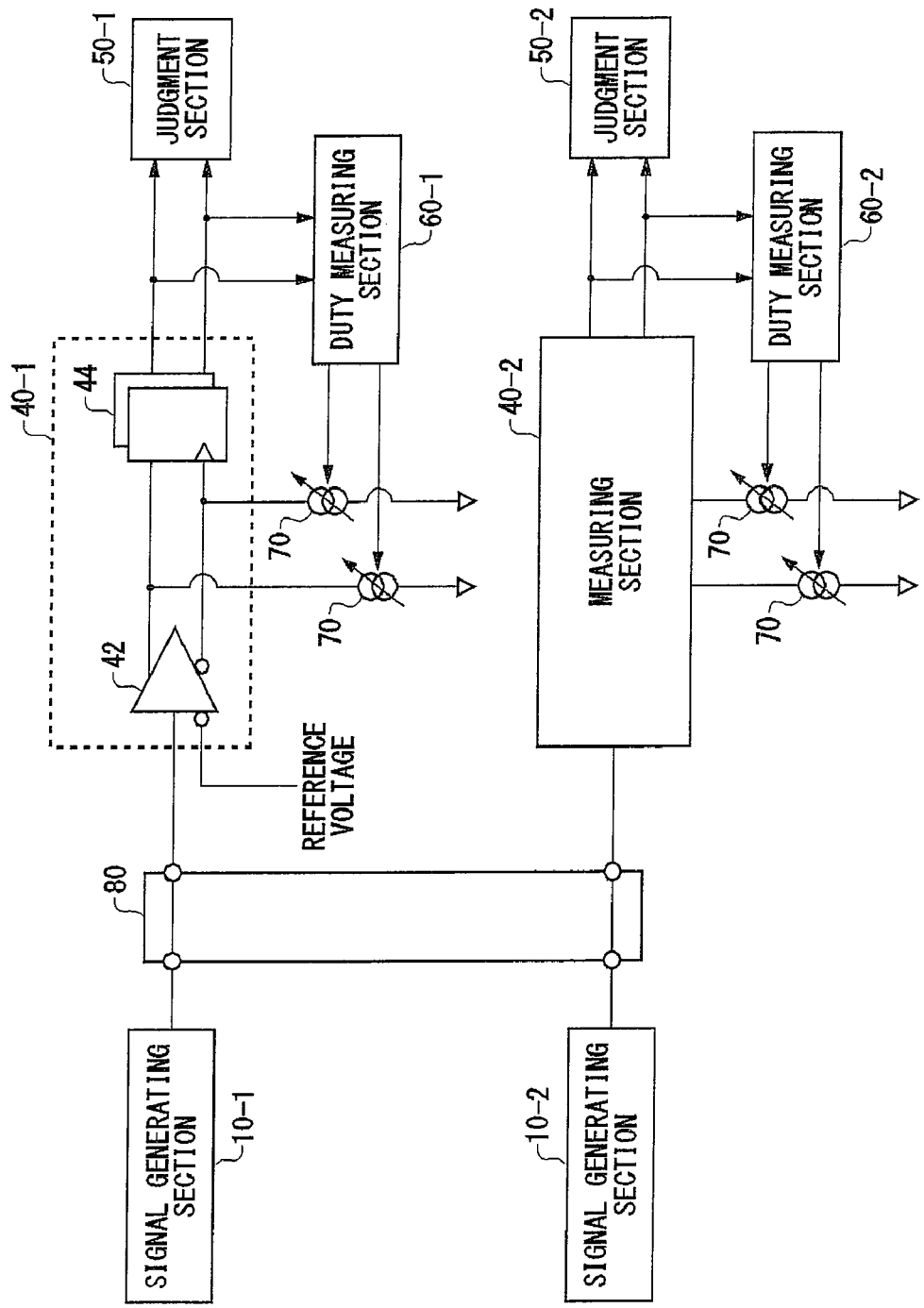
FIG. 9 shows another exemplary configuration of the test apparatus 100.

FIG. 9 shows another exemplary configuration of the test apparatus 100. The test apparatus 100 of the present embodiment corrects the duty ratio error of the waveform output by each measuring section 40 in response to the duty ratio of the waveform input into each measuring section 40. Specifically, as described in relation to FIGS. 1 to 8, an adjustment signal having a prescribed duty ratio is supplied to each measuring section 40 from each signal generating section 10 that adjusts the duty ratio in advance. Each measuring section 40 is adjusted such that the duty ratio of the waveform output therefrom becomes substantially equal to the prescribed duty ratio.

The test apparatus 100 of the present embodiment is further provided with a plurality of duty ratio measuring sections 60, a plurality of measurement side adjusting sections 70, and a calibration board 80 in addition to the configuration of the test apparatus 100 described in relation to FIGS. 1 to 8. Furthermore, each measuring section 40 includes a level comparing section 42 and a timing comparing section 44.

The level comparing section 42 receives the response signal output by the device under test 200 during testing and outputs the waveform according to the received signal. For example, the level comparing section 42 may output a waveform that shows a comparison result between the signal voltage of the received signal and the supplied reference voltage.

More specifically, the level comparing section 42 indicates logic H in a case where the signal voltage of the received signal is greater than or equal to the reference voltage and indicates logic L in a case where the signal voltage of the received signal is less than the reference voltage. Furthermore, the level comparing section 42 may receive the single-end signal and output through a differential waveform the waveform that indicates the comparison result between the signal voltage of the signal and the reference voltage.

The timing comparing section 44 sequentially detects logic values of the waveform output by the level comparing section 42 at sequentially supplied strobe timings. The judgment section 50 may compare the logic pattern detected by the timing comparing section 44 to the expected value pattern.

The calibration board 80 is used before testing of the device under test 200 and connects the signal generating sections 10 to the measuring sections 40. The calibration board 80 may connect a single signal generating section 10 to a plurality of measuring sections 40 or may connect each signal generating section 10 to each measuring section 40 in a one-to-one manner.

The signal generating section 10 outputs an adjustment signal in which the duty ratio is adjusted in advance by the output side adjusting section 24. The signal generating section 10 may output the adjustment signal having a frequency substantially equal to the frequency to be had by the response signal output by the device under test 200. The calibration board 80 inputs the adjustment signal output by the signal generating section 10 into the level comparing section 42 and causes a waveform according to the adjustment signal to be output from the level comparing section 42.

The duty ratio measuring section 60 measures the duty ratio of the waveform output by the level comparing section 42. The duty ratio measuring section 60 of the present embodiment measures the duty ratio based on the logic pattern output by the timing comparing section 44. More specifically, the duty ratio measuring section 60 may measure the duty ratio based on the timing intervals at which the logic values change in the logic pattern.

The measurement side adjusting section 70 adjusts the duty ratio of the waveform output by the level comparing section 42 in a manner such that the duty ratio measured by the duty ratio measuring section 60 becomes substantially equal to the duty ratio of the adjustment signal output by the signal generating section 10. For example, the measurement side adjusting section 70 may have the same configuration and function as the output-side measuring section 24 described in relation to FIG. 5 and FIG. 6. The measurement side adjusting section 70 may adjust the duty ratio by, for example, adjusting the bias voltage of the differential signal output by the level comparing section 42. Through such a configuration, the duty ratio can be easily adjusted in the measuring section 40.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alterations or improvements can be included in the technical scope of the invention.

As made clear from the above, through the embodiments of the present invention, the duty ratio of a measurement waveform and a test signal in a test apparatus such as a semiconductor circuit can be easily and accurately measured.

What is claimed is:

1. A test apparatus that tests a device under test, comprising:
    a driver section that supplies a test signal to a corresponding pin of the device under test;
    a judgment section that makes a judgment concerning pass/fail of the device under test based on a response signal output by the device under test in response to the test signal;
    a level measuring section that detects a DC level of the signal output by the driver section; and
    an output side adjusting section that adjusts a duty ratio of the signal output by the driver section according to the DC level detected by the level measuring section,
    wherein, in a case where the output side adjusting section changes the frequency of the test signal to be supplied to the device under test, the output side adjusting section adjusts in advance the duty ratio of the signal output by the driver section according to the frequency.

2. The test apparatus according to claim 1, further comprising a plurality of signal generating sections, each of which includes the driver section, the level measuring section, and the output side adjusting section.

3. The test apparatus according to claim 2, wherein each level measuring section is disposed in a manner to be capable of measuring a voltage level applied to the device under test when supplying a prescribed current to the device under test.

4. The test apparatus according to claim 3, wherein
    each signal generating section further includes a pattern generating section that causes the corresponding driver section to output an adjustment signal of a predetermined pattern before the driver section supplies the test signal to the device under test, and
    the output side adjusting section adjusts in advance the duty ratio of the signal output by the driver section according to the DC level detected by the level measuring section at a time when the driver section outputs the adjustment signal.

5. The test apparatus according to claim 4, wherein
    each pattern generating section causes the corresponding driver section to output the adjustment signal at substantially the same time, and
    each level measuring section detects the DC level of the adjustment signal output by the corresponding driver section at substantially the same time.

6. The test apparatus according to claim 1, wherein
    the driver section converts an input differential signal into a single-end signal and outputs the thus converted signal, and
    the output side adjusting section adjusts the duty ratio of the test signal to be output by the driver section by adjusting at least one of the bias level to be supplied to the inverted signal or the bias level to be supplied to the non-inverted signal input into the driver section according to the DC level detected by the level measuring section.

7. The test apparatus according to claim 1, wherein the output side adjusting section adjusts the duty ratio of the signal output by the driver section further according to the temperature of the driver section.

8. The test apparatus according to claim 4, wherein
    the pattern generating section sequentially causes the driver section to output a fixed L adjustment signal that is fixed at logic L, a fixed H adjustment signal that is fixed at logic H, and a reference adjustment signal that alternately repeats logic H and logic L, and
    the output side adjusting section adjusts the duty ratio in the driver section such that the DC level of the reference adjustment signal detected by the level measuring section becomes a substantially intermediate level in relation to the DC levels of the fixed H adjustment signal and the fixed L adjustment signal detected by the level measuring section.

9. The test apparatus according to claim 4, wherein
the pattern generating section sequentially outputs to the driver section a low frequency adjustment signal having a frequency lower than the frequency of the test signal to be supplied to the device under test and a reference adjustment signal having a frequency substantially equal to the frequency of the test signal to be supplied to the device under test, and
the output side adjusting section adjusts the duty ratio in the driver section such that the DC level of the reference adjustment signal detected by the level measuring section becomes substantially equal to the DC level of the low frequency adjustment signal detected by the level measuring section.

10. The test apparatus according to claim 4, further comprising a level comparing section that outputs a waveform according to the response signal output by the device under test, wherein
each signal generating section causes the level comparing section to output a waveform according to the adjustment signal by inputting into the level comparing section an adjustment signal in which the duty ratio is adjusted in advance by the output side adjusting section and, and
the test apparatus further comprises a measurement side adjusting section that adjusts the level comparing section such that the duty ratio of the waveform output by the level comparing section according to the adjustment signal becomes substantially equal to the duty ratio of the adjustment signal output by the signal generating section.

11. A test apparatus that tests a device under test, comprising:
a plurality of signal generating sections, each of which includes:
a driver section that supplies a test signal to a corresponding pin of the device under test;
a level measuring section that detects a DC level of the signal output by the driver section;
an output side adjusting section that adjusts a duty ratio of the signal output by the driver section according to the DC level detected by the level measuring section; and
a switching section that switches whether the level measuring section is connected to a transmission path between the driver section and the device under test, the test apparatus further comprising:
a judgment section that makes a judgment concerning pass/fail of the device under test based on a response signal output by the device under test in response to the test signal.

12. The test apparatus according to claim 11, wherein the switching section, when the duty ratio is adjusted in the driver section, causes the level measuring section to measure the signal transmitted on the transmission path using a low-pass filter and, when the voltage level applied to the device under test is measured, causes the level measuring section to measure the signal transmitted on the transmission path without using the low-pass filter.

13. The test apparatus according to claim 11, wherein each level measuring section is disposed in a manner to be capable of measuring a voltage level applied to the device under test when supplying a prescribed current to the device under test.

14. The test apparatus according to claim 13, wherein
each signal generating section further includes a pattern generating section that causes the corresponding driver section to output an adjustment signal of a predetermined pattern before the driver section supplies the test signal to the device under test, and
the output side adjusting section adjusts in advance the duty ratio of the signal output by the driver section according to the DC level detected by the level measuring section at a time when the driver section outputs the adjustment signal.

15. The test apparatus according to claim 14, wherein
each pattern generating section causes the corresponding driver section to output the adjustment signal at substantially the same time, and
each level measuring section detects the DC level of the adjustment signal output by the corresponding driver section at substantially the same time.

16. The test apparatus according to claim 11, wherein
the driver section converts an input differential signal into a single-end signal and outputs the thus converted signal, and
the output side adjusting section adjusts the duty ratio of the test signal to be output by the driver section by adjusting at least one of the bias level to be supplied to the inverted signal or the bias level to be supplied to the non-inverted signal input into the driver section according to the DC level detected by the level measuring section.

17. The test apparatus according to claim 14, wherein
the pattern generating section sequentially causes the driver section to output a fixed L adjustment signal that is fixed at logic L, a fixed H adjustment signal that is fixed at logic H, and a reference adjustment signal that alternately repeats logic H and logic L, and
the output side adjusting section adjusts the duty ratio in the driver section such that the DC level of the reference adjustment signal detected by the level measuring section becomes a substantially intermediate level in relation to the DC levels of the fixed H adjustment signal and the fixed L adjustment signal detected by the level measuring section.

18. The test apparatus according to claim 14, wherein
the pattern generating section sequentially outputs to the driver section a low frequency adjustment signal having a frequency lower than the frequency of the test signal to be supplied to the device under test and a reference adjustment signal having a frequency substantially equal to the frequency of the test signal to be supplied to the device under test, and
the output side adjusting section adjusts the duty ratio in the driver section such that the DC level of the reference adjustment signal detected by the level measuring section becomes substantially equal to the DC level of the low frequency adjustment signal detected by the level measuring section.

19. The test apparatus according to claim 14, further comprising a level comparing section that outputs a waveform according to the response signal output by the device under test, wherein
each signal generating section causes the level comparing section to output a waveform according to the adjustment signal by inputting into the level comparing section an adjustment signal in which the duty ratio is adjusted in advance by the output side adjusting section and, and
the test apparatus further comprises a measurement side adjusting section that adjusts the level comparing section such that the duty ratio of the waveform output by the level comparing section according to the adjustment signal becomes substantially equal to the duty ratio of the adjustment signal output by the signal generating section.

20. A calibration method for adjusting a duty ratio of a test signal in a test apparatus that includes a plurality of driver sections that each supply a test signal to a corresponding pin of a device under test and a judgment section that makes a judgment concerning pass/fail of the device under test based on a signal output by the device under test in response to one of the test signals, comprising:

detecting a DC level of the test signal output by a driver section from among the plurality of driver sections; and adjusting the duty ratio of the test signal output by the driver section according to the detected DC level, wherein, in a case where a frequency of the test signal is changed, the duty ratio is adjusted in advance according to the frequency.

\* \* \* \* \*